United States Patent
Kim

(10) Patent No.: US 8,929,148 B2
(45) Date of Patent: Jan. 6, 2015

(54) SEMICONDUCTOR MEMORY DEVICE HAVING IMPROVED ERASE CHARACTERISTIC OF MEMORY CELLS AND ERASE METHOD THEREOF

(75) Inventor: Hyung Seok Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 340 days.

(21) Appl. No.: 13/293,391

(22) Filed: Nov. 10, 2011

(65) Prior Publication Data

US 2012/0113720 A1  May 10, 2012

(30) Foreign Application Priority Data

Nov. 10, 2010  (KR) .......................... 10-2010-0111570

(51) Int. Cl.
*G11C 11/36* (2006.01)
(52) U.S. Cl.
USPC .................................. 365/185.22; 365/185.29
(58) Field of Classification Search
USPC ............................ 365/185.22, 185.29, 185.17
See application file for complete search history.

(56) References Cited

U.S. PATENT DOCUMENTS

| 7,414,891 | B2 | 8/2008 | Sivero et al. | |
|---|---|---|---|---|
| 2001/0010644 | A1* | 8/2001 | Tsujikawa et al. | 365/185.03 |
| 2002/0080653 | A1* | 6/2002 | Lee et al. | 365/185.22 |
| 2002/0154545 | A1* | 10/2002 | Tanaka et al. | 365/185.22 |
| 2008/0089132 | A1* | 4/2008 | Ito | 365/185.22 |
| 2008/0158997 | A1* | 7/2008 | Hemink et al. | 365/185.22 |
| 2008/0273389 | A1* | 11/2008 | Aritome et al. | 365/185.17 |
| 2008/0279012 | A1* | 11/2008 | Lee | 365/185.19 |
| 2009/0238007 | A1* | 9/2009 | Jang | 365/185.19 |
| 2010/0002523 | A1* | 1/2010 | Park et al. | 365/185.22 |
| 2010/0039864 | A1* | 2/2010 | Sarin et al. | 365/185.22 |

FOREIGN PATENT DOCUMENTS

KR  100811274 B1  2/2008
KR  1020100045674 A  5/2010

* cited by examiner

*Primary Examiner* — Vanthu Nguyen
*Assistant Examiner* — Khamdan Alrobaie
(74) *Attorney, Agent, or Firm* — William Park & Associates Patent Ltd.

(57) ABSTRACT

A semiconductor memory device includes a plurality of memory blocks configured to include memory cells, a voltage supply circuit configured to supply an erase voltage for an erase operation of a memory block selected from the memory blocks and supply an erase verify voltage and an erase pass voltage for an erase verify operation of the memory block selected from the memory blocks, and a control logic configured to group word lines per specific word lines, when the erase verify operation for the selected memory block is performed, and control the voltage supply circuit so that one or more of the erase verify voltage and the erase pass voltage rise whenever the erase verify operation is performed.

14 Claims, 8 Drawing Sheets

SEMICONDUCTOR MEMORY DEVICE HAVING IMPROVED ERASE CHARACTERISTIC OF MEMORY CELLS AND ERASE METHOD THEREOF

CROSS-REFERENCE TO RELATED APPLICATION

Priority to Korean patent application number 10-2010-0111570 filed on Nov. 10, 2010, the entire disclosure of which is incorporated by reference herein, is claimed.

BACKGROUND

Exemplary embodiments relate generally to an integrated circuit, and more particularly to a semiconductor memory device and an erase method thereof.

A semiconductor memory device may be divided into a volatile memory device and a nonvolatile memory device. The volatile memory device requires power to retain the stored data, whereas the nonvolatile memory device retains data stored in the device even in absence of power.

With continued miniaturization of electronic devices, the efforts to highly integrate the semiconductor devices continue.

Also, data storage capacity of a memory device can be increased by configuring each memory cell to store more than one bit. This type of a memory cell is called a multi-level cell (MLC), whereas a memory cell for storing a single bit is called a single level cell (SLC).

In general, the semiconductor memory device includes memory blocks each including a plurality of memory cells, and, according to a known art, an erase operation is performed by the memory block.

In other words, although the semiconductor memory device can be read or programmed a page at a time, it can only be erased a "block" at a time.

Memory cells can be programmed by storing charges in a charge storage site. For example, NAND Flash memory device can be programmed by Fowler-Nordheim (F-N) tunneling. When high voltage is supplied to the control gates of memory cells in the program operation, electrons are accumulated in the floating gates. In the read operation, the threshold voltages of the memory cells, varied according to the amount of electrons accumulated in the floating gates, are detected, and stored data is determined according to the detected threshold voltages.

However, the memory cells may be degraded due to a large number of erase/write (E/W) cycles, and the threshold voltages of the memory cells of an erase state rise when electrons remain in the floating gates even after the erase operation.

Therefore, various methods such as changing a program voltage or a data read voltage according to the number of the erase/write (E/W) cycles are being developed.

BRIEF SUMMARY

An exemplary embodiment relates to a semiconductor memory device and an erase method thereof, wherein an erase voltage and a verify voltage or a pass voltage used when a memory block is erased are changed according to an E/W cycle.

A semiconductor memory device according to an embodiment of the present invention includes a plurality of memory blocks configured to include memory cells, a voltage supply circuit configured to supply an erase voltage for an erase operation of a memory block selected from the memory blocks and supply an erase verify voltage and an erase pass voltage for an erase verify operation of the memory block selected from the memory blocks, and a control logic configured to group word lines per specific word lines, when the erase verify operation for the selected memory block is performed, and control the voltage supply circuit so that one or more of the erase verify voltage and the erase pass voltage rise whenever the erase verify operation is performed.

An operation method of a semiconductor memory device according to an embodiment of the present invention includes the steps of classifying word lines of a memory block into a plurality of word line groups in response to an erase command, performing an erase operation by supplying an erase voltage to the memory block, performing an erase verify operation for each of the word line groups by supplying an erase verify voltage after the erase operation and repeating the steps of performing the erase operation and the erase verify operation until a pass of the erase verify operation, wherein the erase verify voltage rises whenever the erase verify operation is performed.

The erase method further includes the step of classifying word lines of a memory block into a plurality of word line groups in response to an erase command, performing an erase operation by supplying a gradually rising erase voltage to the memory block in response to an erase pulse, performing an erase verify operation for each of the word line groups after the erase operation, wherein the erase verify operation is performed by supplying an erase verify voltage to a word line group, selected from the word line groups, and supplying a gradually rising an erase pass voltage to remaining word line groups and repeating the steps of performing the erase operation and the erase verify operation until a pass of the erase verify operation.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
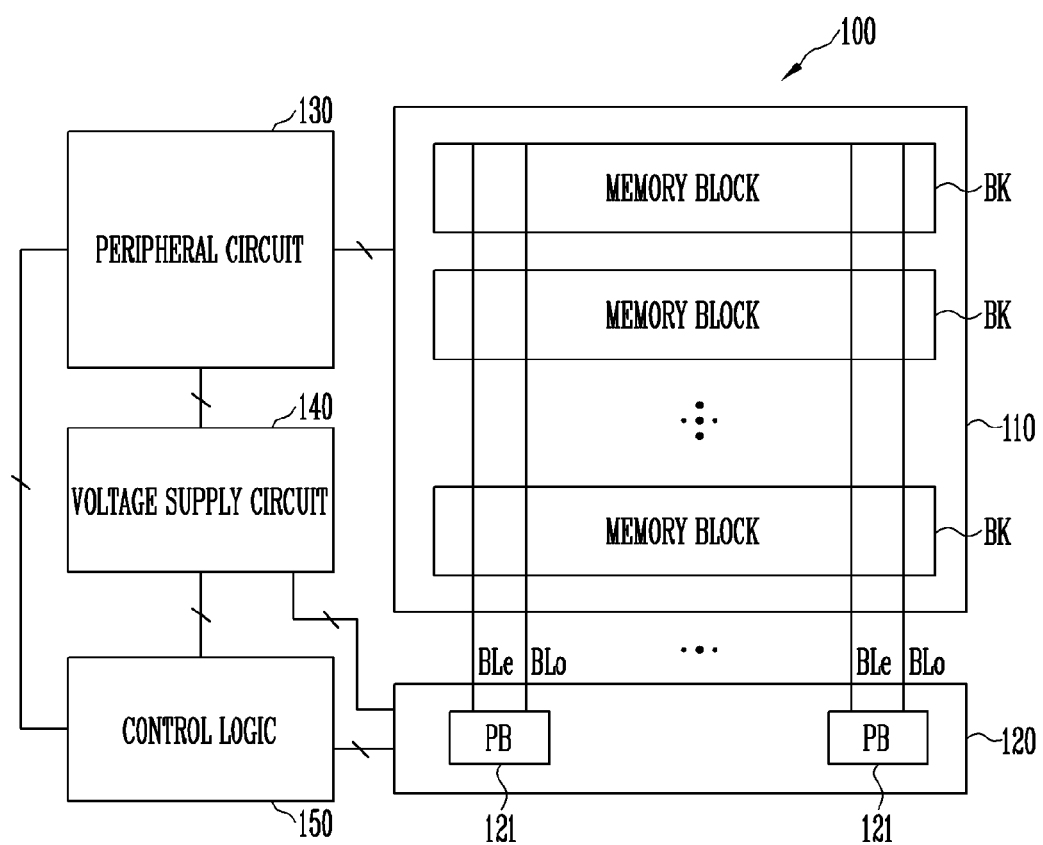
FIG. 1 shows a semiconductor memory device for illustrating an embodiment of the present invention.

FIG. 1 shows a semiconductor memory device for illustrating an embodiment of the present invention.

Referring to FIG. 1, the semiconductor memory device 100 includes a memory cell array 110, a page buffer group 120, a peripheral circuit 130, a voltage supply circuit 140, and a control logic 150.

The memory cell array 110 includes a plurality of memory blocks BK. Each of the memory blocks includes cell strings each including a plurality of memory cells. The configuration of the cell string will be described in detail later.

Each cell string is coupled to a bit line. In an embodiment of the present invention, the bit lines are divided into an even bit line BLe and an odd bit line BLo.

The page buffer group 120 includes a plurality of page buffers PB 121. Each of the page buffers 121 is coupled to a pair of the even bit line BLe and the odd bit line BLo and is operated to store program data in a memory cell coupled to a selected bit line or read data stored in a memory cell coupled to a selected bit line.

The peripheral circuit 130 includes circuits for selecting the memory blocks BK of the memory cell array 110 and for performing program, read, and erase operations.

The voltage supply circuit 140 generates a program voltage Vpgm, a read voltage Vread, and an erase voltage Verase for the program, read, and erase operations and outputs control voltages for controlling the page buffers 121.

The control logic 150 controls the operations of the page buffer group 120, the peripheral circuit 130, and the voltage supply circuit 140.

When a memory block BK is erased, according to an embodiment of the present invention, the control logic 150 determines the E/W cycle of the memory block BK based on the number of erase pulses supplied and changes voltage to be used in an erase verify operation, voltage supplied to a word line during the erase operation, etc. according to a result of the determination in order to prevent an incomplete erasure.

The memory block BK of the semiconductor memory device 100 is described below.

Figure 2:
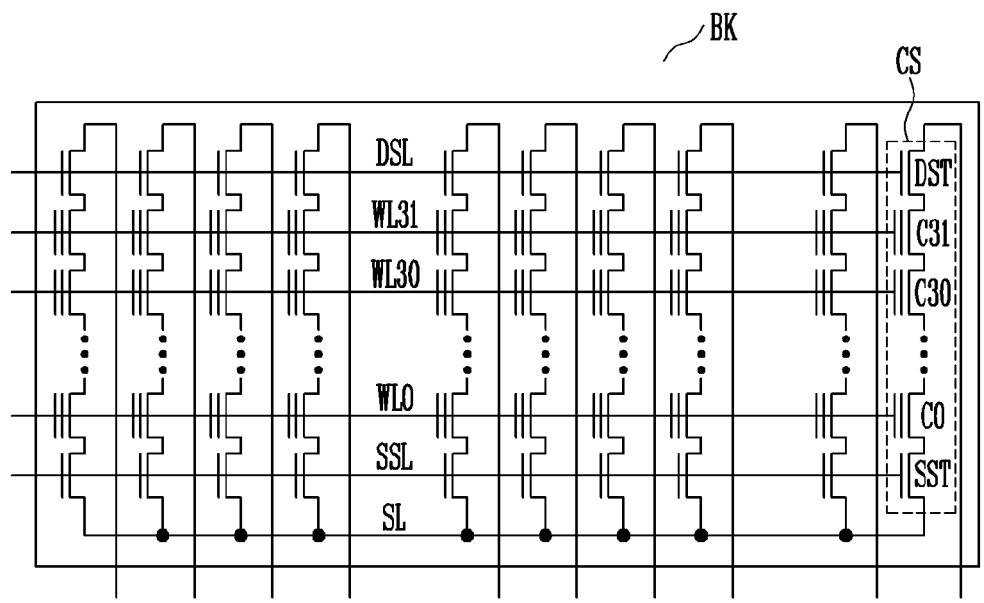
FIG. 2 shows a detailed configuration of a memory block of FIG. 1.

FIG. 2 shows a detailed configuration of the memory block BK of FIG. 1.

Referring to FIG. 2, the memory block BK includes the plurality of cell strings. Each cell string is coupled to the even bit line BLe or the odd bit line BLo.

Furthermore, each cell string includes a drain select transistor DST, a source select transistor SST, and $0^{th}$ to $31^{st}$ memory cells C0 to C31.

The gate of the drain select transistor DST is coupled to a drain select line DSL, and the gate of the source select transistor SST is coupled to a source select line SSL.

Furthermore, the gates of the $0^{th}$ to $31^{st}$ memory cells C0 to C31 are coupled to respective $0^{th}$ to $31^{st}$ word lines WL0 to WL31.

The $0^{th}$ to $31^{st}$ memory cells C0 to C31 are coupled in series between the drain select transistor DST and the source select transistor SST.

The drain of the drain select transistor DST is coupled to the bit line BLe or BLo, and the source of the source select transistor SST is coupled to a common source line SL.

In the semiconductor memory device 100, an erase operation is performed on a memory-block basis.

Furthermore, the number of performed program and erase operations for a memory block BK is called an E/W cycle.

Each of the $0^{th}$ to $31^{st}$ memory cells C0 to C31 is, according to an example, a transistor including a floating gate. The threshold voltage of the memory cell may vary according to the amount of charges stored in the floating gate. Data is stored or erased by putting charges into the floating gate or removing the charges from the floating gate.

Here, raising the threshold voltage of the memory cell by putting the charges into the floating gate is called a program operation, lowering the threshold voltage of the memory cell to 0 V or less by removing the charges from the floating gate is called an erase operation.

There is a tendency that the threshold voltages of the memory cells of the memory block BK increase with an increase in the E/W cycle of the memory block BK. This is because, even after the erase operation is performed, the charges are stuck in the floating gates of the memory cells.

Here, with the increase of the E/W cycle, the amount of charges stuck in the floating gates of the memory cells may increase.

In order to reduce the occurrence of error due to the phenomenon described above and thus improve reliability of data stored in the memory cells, the E/W cycle may be counted and stored per memory block, and a program voltage, a read voltage, and an erase voltage may be controlled according to the stored E/W cycle.

However, in an erase method according to an embodiment of the present invention, the E/W cycle for the memory block BK is not counted, but the erase verify voltage or a erase pass voltage is controlled according to the E/W cycle which is determined to be increased according to the number of erase pulses supplied during the erase operation.

Figure 3:
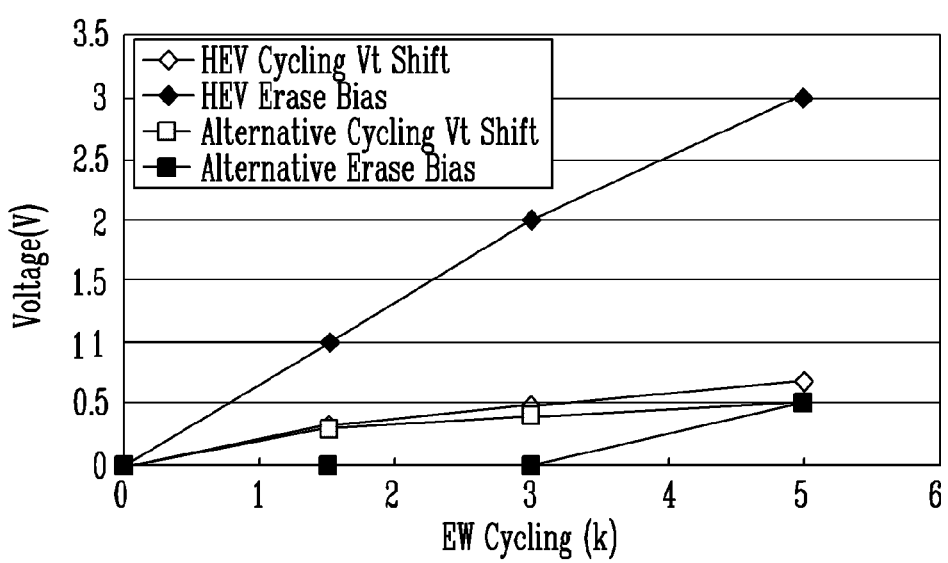
FIG. 3 shows a change in the erase voltage and the erase verify voltage according to an E/W cycle.

FIG. 3 shows a change in an erase voltage and an Vt shift according to the E/W cycle.

From FIG. 3, "HEV Cycling Vt Shift" is a degree that a threshold voltage of a memory cell is changed according to the E/W cycle in hard erase method, and "HEV Erase Bias" is a degree that an erase bias is changed according to the E/W cycle in hard erase method.

And "Alternative Cycling Vt Shift" is the degree that the threshold voltage of the memory cell is changed according to the E/W cycle in an illustrative embodiment, and "Alternative Erase Bias" is the degree that the erase bias is changed according to the E/W cycle in an illustrative embodiment.

From FIG. 3, it can be seen that the erase voltage rises and the degree that a threshold voltage of a memory cell is changed (Vt shift) increases according to an increase of the E/W cycle.

In a hard erase method, the erase operation is performed by selecting all word lines of a memory block. However, in an erase method according to an embodiment of the present invention, word lines of a memory block are divided into groups, and the erase operation is performed for each group.

Referring to FIG. 3, it can be seen that when the erase operation is performed for each group, the degree of shift by the threshold voltage of the memory cell and the degree of increase in the erase voltage decrease.

Therefore, it is necessary to control the erase voltage or the erase verify voltage for the erase operation according to an increase of the E/W cycle.

Figure 4:
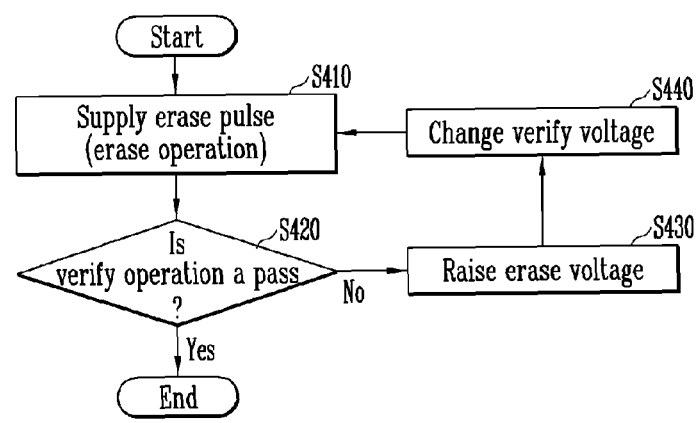
FIG. 4 is a flowchart illustrating an erase method according to an embodiment of the present invention.
Figure 5:
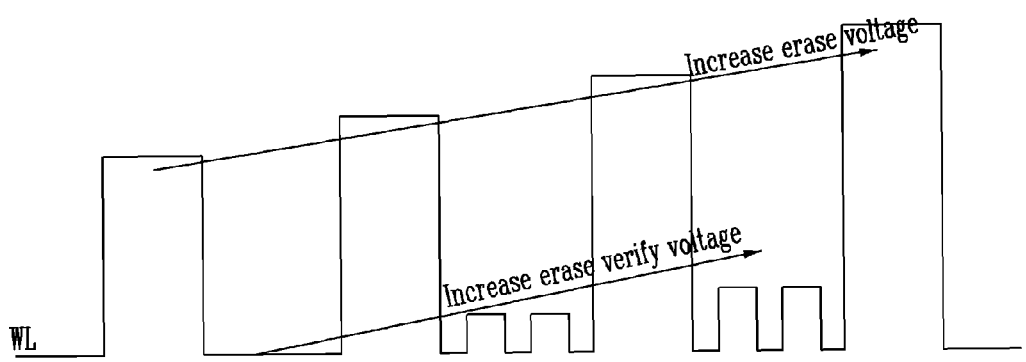
FIG. 5 shows an erase voltage and an erase verify voltage applied according to an embodiment of the present invention.

FIG. 4 is a flowchart illustrating an erase method according to an embodiment of the present invention, and FIG. 5 shows an erase voltage and an erase verify voltage applied according to an embodiment of the present invention.

Referring to FIG. 4, during an erase operation, the control logic 150 generates an erase pulse, and an erase voltage is supplied to the well of a selected memory block BK at step S410.

When the erase operation is performed at the selected memory block BK, voltage of 0 V is supplied to all the word lines of the selected memory block BK, and the erase voltage is supplied to the well of the selected memory block BK. Accordingly, electrons stored in the floating gates of the memory cells are discharged, so that the threshold voltages of memory cells coupled to the word lines drop to 0 V or less.

Here, the erase voltage of the erase pulse increases by a certain step voltage in accordance with an incremental step pulse erase (ISPE) method.

An erase verify operation using an erase verify voltage is performed at step S420 after the erase pulse is applied in order to determine whether the memory cells has passed the erase verify operation. If the memory cells has passed the erase verify operation, the erase operation is finished.

If the memory cells has not passed the erase verify operation, the erase voltage is increased according to the ISPE method at step S430. Next, the erase verify voltage is also raised according to an embodiment of the present invention at step S440. Here, the erase verify voltage may be raised by a predetermined value. For example, if 0 V is supplied to the word lines during an erase verify operation before raising the erase verify voltage, a voltage corresponding to the predetermined value would be applied at the following erase operation.

Here, the reason why the erase verify operation has not passed may be threshold voltage shift due to charges stuck in the floating gate after large E/W cycle. Accordingly, if the erase verify voltage is also raised, a change in the threshold voltages can be compensated.

FIG. 5 shows that an erase verify voltage is also raised with an increase of an erase voltage. The reason why the erase verify voltage is supplied twice is that an erase verify operation for even bit lines and an erase verify operation for odd bit lines are sequentially performed.

An embodiment of the present invention described with reference to FIG. 4 corresponds to erase and verify operations for all the word lines of a selected memory block.

In an embodiment of the present invention, the word lines of a selected memory block may be divided into groups, and a change in the threshold voltages of memory cells by the E/W cycle may be compensated for by independently controlling voltages for each group.

When the erase verify operation for the word lines of the selected memory block is performed, an erase verify voltage and a pass voltage are supplied to a selected word line and the remaining word lines, respectively.

In an embodiment of the present invention, a method of changing an erase voltage or a pass voltage may be used.

When an erase command is inputted, option information about whether the erase verify voltage or the pass voltage is to be changed and about how word lines are to be grouped is inputted to the semiconductor memory device.

Figure 6:
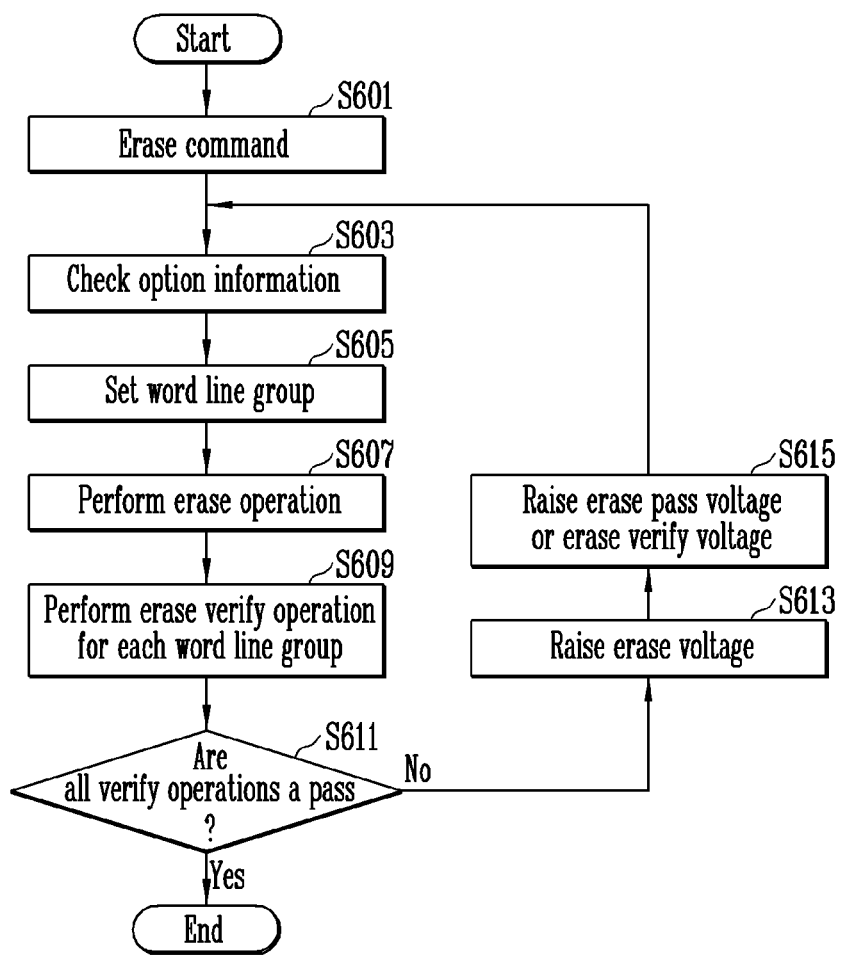
FIG. 6 a flowchart illustrating an erase method according to an embodiment of the present invention.

FIG. 6 a flowchart illustrating an erase method according to an embodiment of the present invention.

FIG. 6 shows an example where a hard erase operation is performed. Here, soft program and soft program verify operations after the hard erase operation may be performed.

Referring to FIG. 6, when an erase command is received at step S601, the control logic 150 of the semiconductor memory device 100 checks option information received together with the erase command at step S603.

The option information may include information about whether one or more of an erase verify voltage and a pass voltage are to be changed and about how word lines is to be grouped.

Referring to FIGS. 1 and 6, the control logic 150 controls the voltage supply circuit 140 so that the erase verify voltage or the pass voltage is changed based on the option information.

Next, the control logic 150 determines the word line group of the selected memory block BK based on the option information at step S605.

In addition, the word lines may be grouped into even word lines and odd word lines or may be grouped by N word lines (e.g., N is equal to or greater than 1 and smaller than 32) based on the option information.

For example, when the option information of N=4 is received, the control logic 150 may group the word lines of the selected memory block into four word line groups. For another example, the option information of N=1 means that a verify operation is performed on a word line basis (e.g. word line by word line).

The control logic 150 classifies the word lines into groups based on the option information and then performs an erase operation for erasing the memory cells of the selected memory block BK by supplying an erase voltage at step S607.

After the erase operation is performed, erase verify operations for the word line groups are sequentially performed.

For example, if the word lines are grouped by four word lines, 32 word lines are classified into first to eighth word line groups. Accordingly, eight erase verify operations are performed for each of the eight word line groups.

During the erase verify operation for the first word line group, an erase verify voltage is supplied to the $0^{th}$ to third word lines WL0 to WL3, and a pass voltage Vpass is supplied to the remaining word lines.

During the erase verify operation for the second word line group, the erase verify voltage is supplied to the fourth to seventh word lines WL4 to WL7, and a pass voltage Vpass is supplied to the remaining word lines.

As described above, the erase verify operations for the first to eighth word line groups are sequentially performed. The erase verify voltage is supplied to the word lines of a selected word line group, and the pass voltage is supplied to the word lines of the remaining word line groups.

If the erase verify operation is performed on a group basis (e.g., group by group), the erase characteristic of the memory cells can be further improved, as compared with an erase verify operation performed for all the word lines, and the time can be reduced, as compared with an erase verify operation performed on a word line basis.

In addition, if the even bit line BLe and the odd bit line BLo are coupled to one page buffer, each word line group is further divided into an even page group and an odd page group.

For example, a first word line group may be divided into an even page group and an odd page group, and another word line group may be divided into another even page group and another odd page group.

If a page buffer is coupled to a bit line, however, the erase verify operation is performed for every word line group, and thus it is not necessary to divide the word line group into an even page group and an odd page group.

After the erase verify operations for the word line groups are finished as S609, it is checked whether all the word line groups have passed the erase verify operations at step S611.

A condition of pass in the erase verify operations may be set in various ways.

For example, if all the memory cells of all the word line groups have passed the erase verify operations, the condition may be determined to be a pass. For another example, if, for example, only a specific number of bits or less have not passed the erase verify operations in the case of an error correction function has been set, the condition may be determined to be a pass.

If, as a result of the check, the erase verify operations are determined to have been passed, the hard erase operation no longer needs to be performed.

If, as a result of the check, however, the erase verify operations are determined to have not been passed, the erase voltage of the erase pulse is raised again according to the ISPE method at step S613. Next, one or more of the erase verify voltage and the pass voltage is raised at step S615 based on the option information, checked at step S603.

In addition, the erase verify voltage and the pass voltage may be raised at the same time. Also, any one of the erase verify voltage and the pass voltage may be raised.

Here, the pass voltage Vpass is higher than 0 V, but lower than the pass voltage used in the program or read operation.

Furthermore, there is an effect that memory cells, having threshold voltages of 0 V or less and coupled to a selected word line, can be verified based on a difference in the voltage between the selected word line and the remaining word lines.

A method of grouping the word lines may include a method of selecting even word lines and odd word lines from the word lines and a method of setting a value N and grouping the word lines per N word lines.

FIGS. 7A to 7D show voltages applied to the word lines during the erase operation of FIG. 6.

Figure 7A:
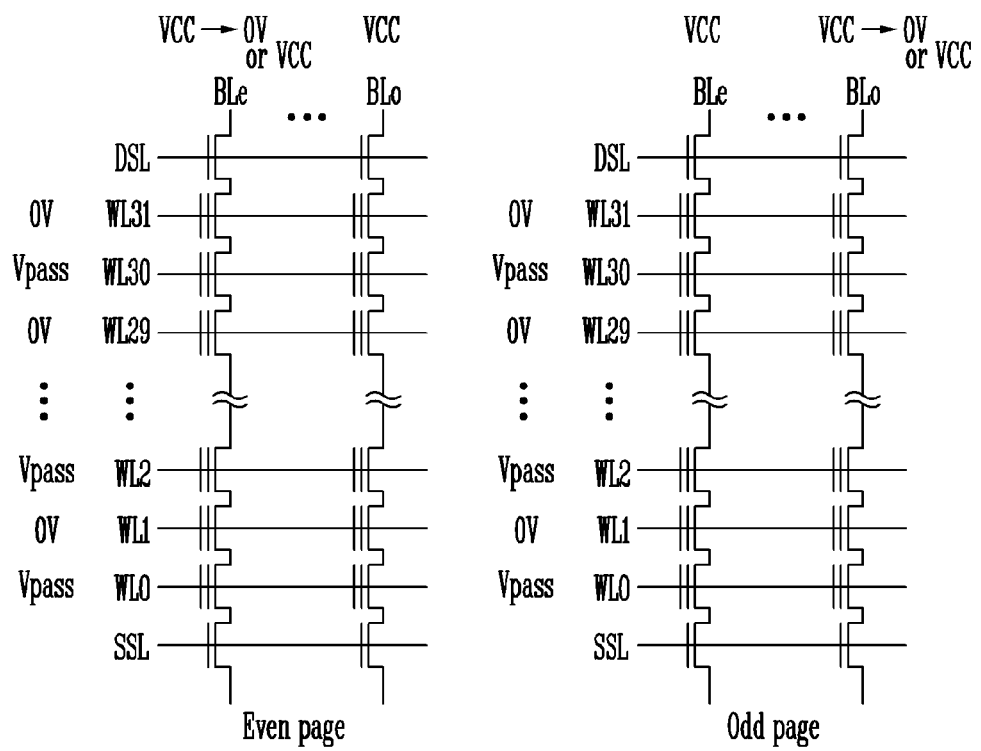
FIGS. 7A to 7D show voltages applied to word lines during the erase operation of FIG. 6.
Figure 7B:
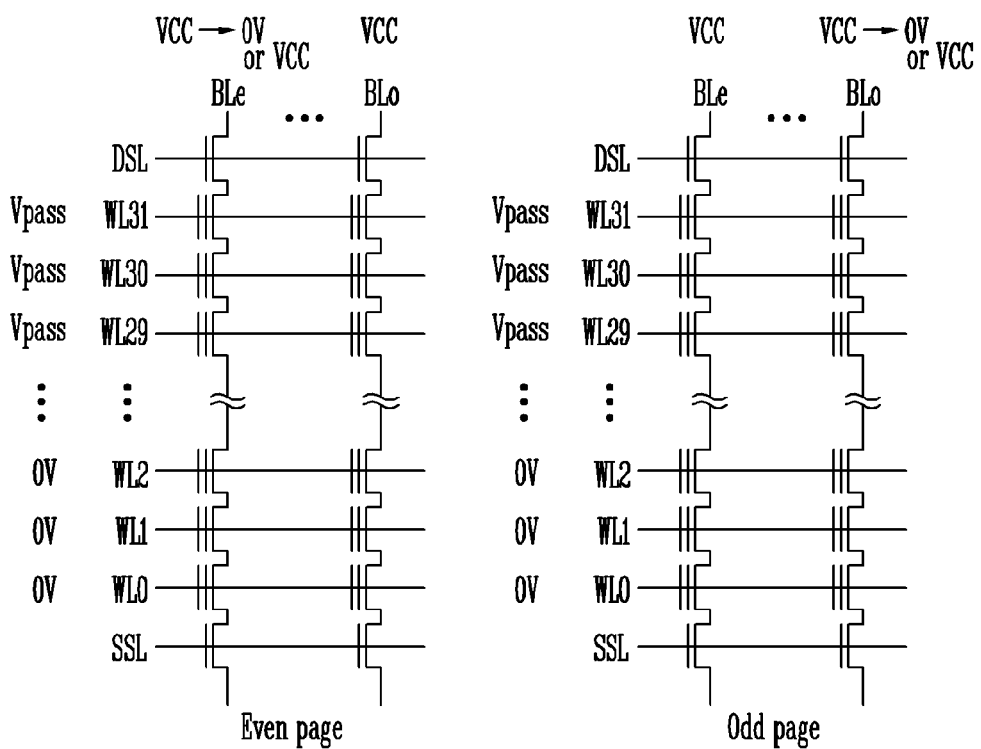
Figure 7C:
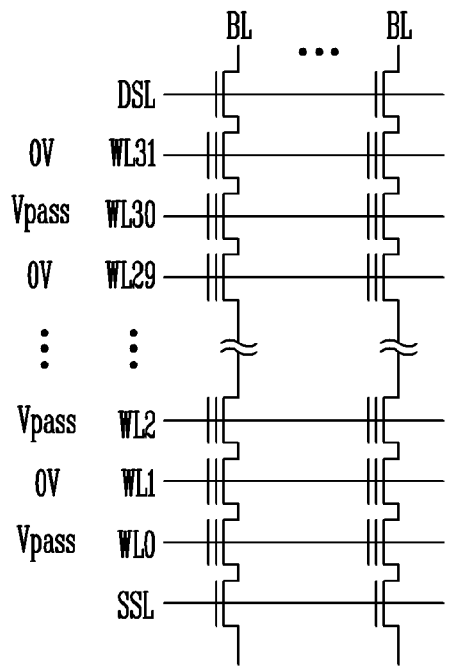
Figure 7D:
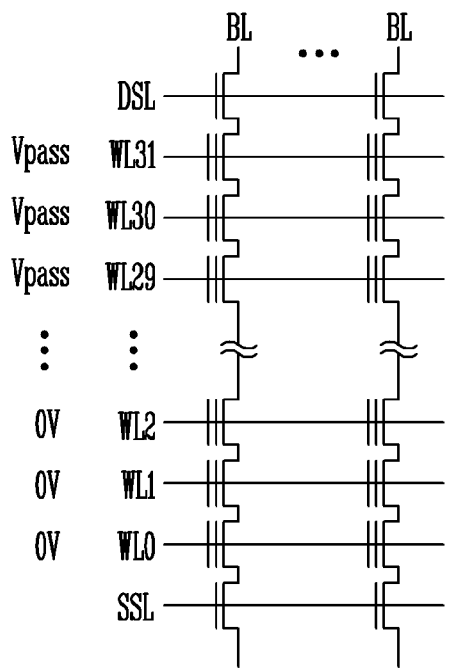

FIGS. 7A and 7C show examples where the voltages are supplied when an even word line group or an odd word line group is selected, and FIGS. 7B and 7D show examples where the voltages are supplied when the word lines are grouped per 3 word lines.

Furthermore, FIGS. 7A and 7B show examples where the voltages are supplied when the bit lines are divided into even bit lines and odd bit lines and the odd word lines for selecting a page are selected.

Furthermore, FIGS. 7C and 7D show examples where the voltages are supplied when pages are not divided into even bit lines and odd bit lines.

FIG. 7A shows an example where the voltages are supplied when the even bit lines BLe are selected and the odd word lines BLo are selected. A erase verify voltage 0 V is supplied to the odd word lines WL1, WL3, . . . , WL31 (that is, selected word lines), and a erase pass voltage Vpass is supplied to the remaining word lines WL0, WL2, . . . , WL30 (that is, unselected word lines).

Next, the selected even bit lines BLe are precharged to a power supply voltage VCC and then discharged to 0 V or maintained at the power supply voltage VCC according to a result of verification. Here, the unselected odd bit lines BLo remain precharged with the power supply voltage VCC.

If the odd bit lines BLo are selected, the odd bit lines BLo are precharged to the power supply voltage VCC and then discharged to 0 V or maintained at the power supply voltage VCC.

According to an embodiment of the present invention, in FIG. 7A, the option information may be set so that the erase verify voltage supplied to the selected even word lines is gradually raised or the erase pass voltage Vpass supplied to the remaining odd word lines is gradually raised.

The option information, together with the erase command, may be received.

Furthermore, the option information may be set so that the word lines are grouped per N word lines without classifying the word lines into the even word lines and the odd word lines.

FIG. 7B shows an example where the word lines are grouped per 3 word lines and erase verify operations are performed for the word line groups. A first word line group includes the 0$^{th}$ to second word lines WL0 to WL2. When the first word line group is selected, a erase verify voltage 0 V is supplied to the 0$^{th}$ to second word lines WL0 to WL2, and a erase pass voltage Vpass is supplied to the remaining word lines.

A change of the voltage supplied to the even and odd bit lines may vary according to which bit line is selected. This has been described with reference to FIG. 7A.

Furthermore, if the word lines are grouped per N word lines as shown in FIG. 7B, the option information may be set so that the erase verify voltage is gradually raised from 0 V or the erase pass voltage Vpass is gradually raised.

FIGS. 7C and 7D show examples where the word lines are grouped into an even word line group and an odd word group or the word lines are grouped per 3 word lines without dividing the bit lines into even bit lines and odd bit lines, as in FIGS. 7A and 7B.

If the bit lines are not divided into the even and odd bit lines, it means that each page buffer is coupled to each bit line.

In FIGS. 7C and 7D, the option information may be set so that any one of the erase verify voltage and the erase pass voltage is gradually raised.

In addition, soft program and soft program verify operations may be performed after all the erase verify operations have been passed at step S613 of FIG. 6.

Here, the soft program may be performed by grouping the word lines into even and odd word line groups or grouping the word lines per N word lines.

Figure 8:
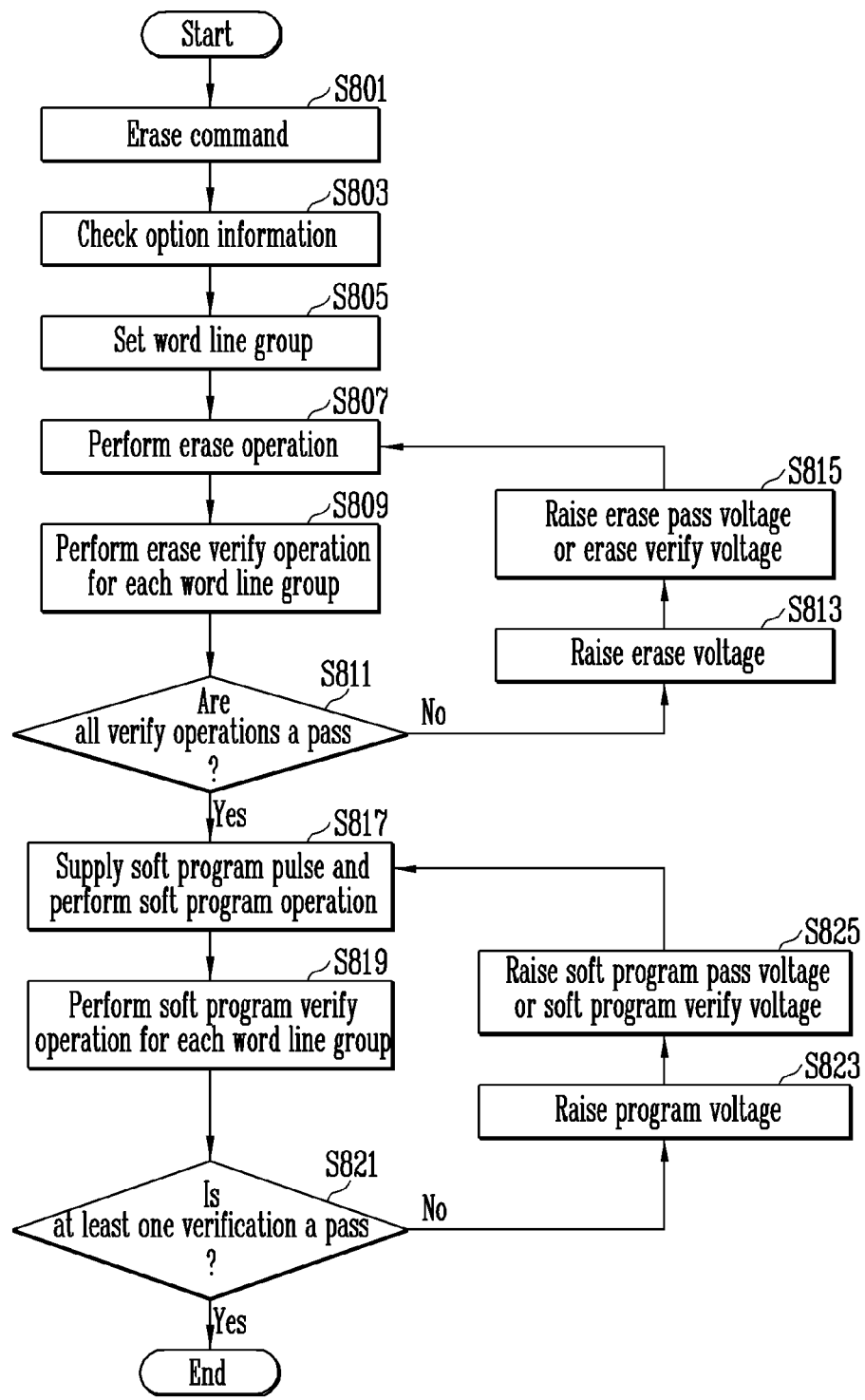
FIG. 8 is a flowchart illustrating an erase method according to an embodiment of the present invention.

FIG. 8 is a flowchart illustrating an erase method according to an embodiment of the present invention.

Referring to FIG. 8, when an erase operation is started, erase and erase verify operations are performed at steps S801 to S813, like in steps S601 to S613 of FIG. 6. The erase verify operations are sequentially performed for the word line groups.

The word line group may include an even word line group and an odd word line group or may include groups of N word lines.

In addition, a soft program verify operation may be performed like the erase verify operation.

In other words, after the soft program operation is performed in response to a soft program pulse at step S817, the soft program verify operation is performed for each of the word line groups at step S819.

The word line group is determined according to an erase command, e.g. the word line group set at step S805.

If, as a result of the soft program verify operations for all the word line groups, at least one bit of each word line group is determined to have passed at step S821, the soft program verify operation is finished.

If all the word line groups have not passed verification, a program voltage is raised according to the ISPP method at step S823.

Next, one or more of a soft program verify voltage and a soft program pass voltage is gradually raised based on the option information received along with the erase command at step S825.

The option information may be set differently from option information for a hard erase verify operation.

That is, in the hard erase verify operation, the option information may be set so that the erase verify voltage is gradually raised, and in the soft program verify operation, the option information may be set so that the soft program pass voltage is gradually raised.

In some embodiments, in the hard erase verify operation, the option information may be set so that the erase pass voltage is raised, and in the soft program verify operation, the option information may be set so that the soft verify voltage is raised.

In some embodiments, in both the hard erase verify operation and the soft erase verify operation, the option information may be set so that the erase and soft program pass voltage or the erase and soft program verify voltage is raised.

The erase and soft program pass voltage and the erase and soft program verify voltage may be set in various ways based on the option information received along with the erase command. Furthermore, the word line groups may be differently set in the hard erase operation and the soft program operation.

While the soft program operation is performed as described above, the program verify operation is performed by grouping the word lines into the even word line group and the odd word line group or grouping the word lines per N word lines, without performing the same program verify operation for all the word lines. In this case, the program verify operation can be performed more accurately.

Figure 9A:
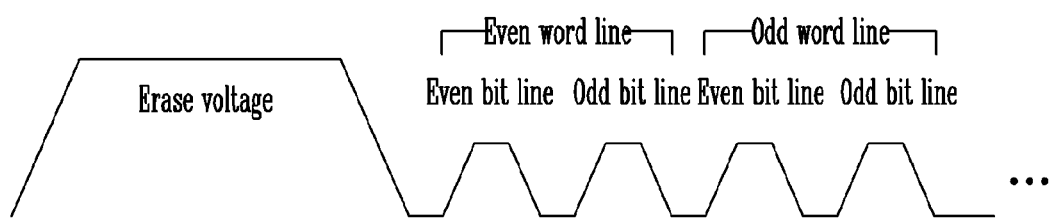
FIGS. 9A and 9B show voltage pulses supplied during the erase operations of FIGS. 6 and 8.
Figure 9B:
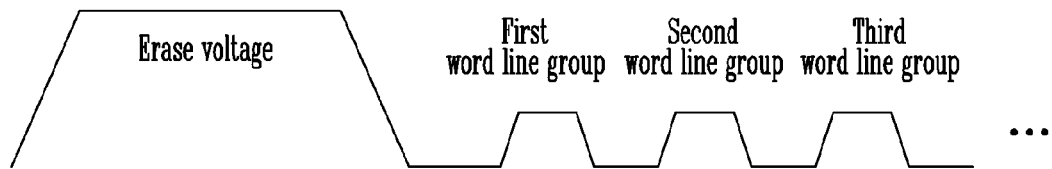

FIGS. 9A and 9B show voltage pulses supplied during the erase operations of FIGS. 6 and 8.

FIG. 9A shows an example where verify operations are performed by grouping the word lines into an even word line group and an odd word line group and grouping the bit lines into even bit lines and odd bit lines.

In this case, in FIG. 9A, after an erase pulse for an erase operation is supplied, four verify pulses for erase verify operations are supplied. In a soft program verify operation, four program verify pulses may be supplied even after a program pulse is supplied.

FIG. 9B shows an example where the word lines are grouped per N word lines without dividing the bit lines into even bit lines and odd bit lines. After a single erase voltage is supplied, erase voltages are sequentially supplied to a first word line group, a second word line group, and a third word line group.

TABLE 1

| OPTION | OPERATION | |
|---|---|---|
| | Hard erase | Soft program |
| 1 | Erase Verify voltage | Soft program Pass voltage |
| 2 | Erase Verify voltage | Soft program Verify voltage |
| 3 | Erase Pass voltage | Soft program Pass voltage |
| 4 | Erase Pass voltage | Soft program Verify voltage |

Table 1 shows voltages changed when verify operations are performed in the hard erase operation and the soft program operation according to the options.

The four types of the options are possible. In a hard erase verify operation and a soft program verify operation, the erase or soft program pass voltage or the erase or soft program verify voltage may be identically changed or the erase or soft program pass voltage or the erase or soft program verify voltage may be differently changed.

In the semiconductor memory device and the erase method thereof according to some exemplary embodiments of this disclosure, when a memory block is performed, not only an erase voltage supplied to a word line, but also an erase verify voltage or a pass voltage is raised. Accordingly, the erase characteristic of memory cells within the memory block can be improved.

What is claimed is:

1. A semiconductor memory device, comprising:
   a plurality of memory blocks configured to comprise memory cells;
   a voltage supply circuit configured to, when an erase operation and an erase verify operation following the erase operation are repeatedly performed, supply an erase voltage for the erase operation of a memory block selected from the memory blocks and supply an erase verify voltage and an erase pass voltage for the erase verify operation of the memory block selected from the memory blocks; and
   a control logic configured to group word lines per specific word lines, when the erase verify operation for the selected memory block is performed, and control the voltage supply circuit so that one or more of the erase verify voltage and the erase pass voltage rise whenever the erase verify operation is performed,
   wherein a soft program operation of the selected memory block and a soft program verify operation of the selected memory block are repeatedly performed after a pass of the erase verify operation,
   wherein the voltage supply circuit supplies a soft program voltage for the soft program operation and supplies a soft program verify voltage and a soft program pass voltage for the soft program verify operation,
   wherein the control logic controls the voltage supply circuit so that one or more of the soft program verify voltage and the soft program pass voltage rise whenever the soft program verify operation is performed.

2. The semiconductor memory device of claim 1, wherein the control logic controls the voltage supply circuit so that the erase verify voltage is supplied to word lines included in a word line group selected from the word line groups and the erase pass voltage is supplied to a remaining word line group, when the erase verify operation is performed.

3. The semiconductor memory device of claim 1, wherein the control logic controls the voltage supply circuit so that the soft program verify voltage is supplied to word lines included in a word line group selected from the word line groups and the soft program pass voltage is supplied to a remaining word line group, when the soft program verify operation is performed.

4. An operation method of a semiconductor memory device, comprising the steps of:
   classifying word lines of a memory block into a plurality of word line groups in response to option information received along with an erase command;
   performing an erase operation by supplying an erase voltage to the memory block;
   performing an erase verify operation for each of the word line groups by supplying an erase verify voltage to a corresponding word line group and supplying an erase pass voltage to a remaining word line group after the erase operation;
   repeating the steps of performing the erase operation and the erase verify operation until a pass of the erase verify operation, wherein one or more of the erase verify voltage and the erase pass voltage rise whenever the erase verify operation is performed;
   performing a soft program operation to the memory block after the pass of the erase verify operation;
   performing a soft program verify operation for each of the word line groups by supplying a soft program verify voltage to a corresponding word line group and supplying a soft program pass voltage to a remaining word line group after the soft program operation; and
   repeating the steps of performing the soft program operation and the soft program verify operation until a pass of the soft program verify operation, wherein one or more of the soft program verify voltage and the soft program pass voltage rise whenever the soft program verify operation is performed.

5. The operation method of claim 4, wherein the erase verify operation is performed by sequentially selecting the word line groups and supplying the erase verify voltage to selected word lines of each of the selected word line groups, and a erase pass voltage to remaining word lines of each of the selected word line groups.

6. The operation method of claim 5, wherein each of the word line groups comprises a first word line group including even word lines and a second word line group including odd word lines.

7. The operation method of claim 6, wherein:
the first word line group comprises a third word line group including even bit lines and a fourth word line group including odd bit lines, and
the second word line group comprises a fifth word line group including even bit lines and sixth word line group including odd bit lines.

8. The operation method of claim 4, wherein each of the word line groups includes word lines selected according to a number set based on option information received along with the erase command.

9. The operation method of claim 8, wherein the word line group including the selected word lines is divided into a word line group including even bit lines and a word line group including odd bit lines.

10. An erase method of a semiconductor memory device, comprising the steps of:
classifying word lines of a memory block into a plurality of word line groups in response to option information received along with an erase command;
performing an erase operation by supplying an erase voltage to the memory block;
performing an erase verify operation for each of the word line groups after the erase operation, wherein the erase verify operation is performed by supplying an erase verify voltage to each word line group selected from the word line groups, and supplying an erase pass voltage to a remaining word line group;
repeating the steps of performing the erase operation and the erase verify operation until a pass of the erase verify operation,
wherein one or more of the erase verify voltage and the erase pass voltage rise whenever the erase verify operation is performed;
repeatedly performing a soft program operation and a soft program verify operation for the memory block after the pass of the erase verify operation, wherein the soft program verify operation is performed for each of the word line groups by supplying a soft program verify voltage to each word line group selected from the word line group and supplying a soft program pass voltage to a remaining word line group, wherein one or more of the soft program verify voltage and the soft program pass voltage rise, whenever the soft program verify operation is performed.

11. The erase method of claim 10, wherein each of the word line groups comprises a first word line group including even word lines and a second word line group including odd word lines.

12. The erase method of claim 11, wherein:
the first word line group comprises a third word line group including even bit lines and a fourth word line group including odd bit lines, and
the second word line group a fifth word line group including even bit lines and sixth word line group including odd bit lines.

13. The erase method of claim 10, wherein each of the word line groups includes word lines selected according to a number set based on option information received along with the erase command.

14. The erase method of claim 13, wherein the word line group including the selected word lines is divided into a word line group including even bit lines and a word line group including odd bit lines.

* * * * *